(12) United States Patent
Li et al.

(10) Patent No.: US 9,922,985 B2
(45) Date of Patent: Mar. 20, 2018

(54) SEMICONDUCTOR MEMORY DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Guan Hua Li, Shanghai (CN); Hae Wan Yang, Shanghai (CN); Sheng Fen Chiu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/452,869

(22) Filed: Mar. 8, 2017

(65) Prior Publication Data
US 2017/0287922 A1    Oct. 5, 2017

(30) Foreign Application Priority Data
Mar. 30, 2016   (CN) .......................... 2016 1 0192683

(51) Int. Cl.
*H01L 29/788*   (2006.01)
*H01L 27/11521*   (2017.01)
(Continued)

(52) U.S. Cl.
CPC ...... *H01L 27/11521* (2013.01); *H01L 29/511* (2013.01); *H01L 29/66825* (2013.01)

(58) Field of Classification Search
CPC ......... H01L 29/66825; H01L 27/11521; H01L 29/788; H01L 29/511
(Continued)

(56) References Cited

U.S. PATENT DOCUMENTS

| 7,056,828 B2 * | 6/2006 | Chung | .............. H01L 21/76829 |
| | | | 257/774 |
| 2003/0178688 A1 * | 9/2003 | Yang | .................. H01L 21/31116 |
| | | | 257/395 |

(Continued)

OTHER PUBLICATIONS

The European Patent Office (EPO) The Extended European Search Report for 17162368.9 Aug. 18, 2017 9 Pages.

*Primary Examiner* — Theresa T Doan
(74) *Attorney, Agent, or Firm* — Anova Law Group, PLLC

(57) ABSTRACT

A method is provided for fabricating a semiconductor memory device. The method includes providing a substrate and forming a stacked layer on the substrate, where the stacked layer includes a tunneling dielectric layer and a floating gate layer sequentially formed on the substrate. The method also includes forming a plurality of stacked structures by etching the stacked layer and the substrate, where the spacing between the adjacent stacked structures forms a plurality of parallel first trenches. In addition, the method includes forming a plurality of second trenches and forming a plurality of third trenches. Moreover, the method includes forming a second dielectric layer on the floating gate layer and the side wall and bottom of the third trenches and forming a control gate layer on the second dielectric layer. Further, the method includes forming a plurality of fourth trenches and removing the sacrificial layer along the fourth trenches.

12 Claims, 10 Drawing Sheets

(51) Int. Cl.
*H01L 29/66* (2006.01)
*H01L 29/51* (2006.01)

(58) Field of Classification Search
USPC .......................................................... 257/316
See application file for complete search history.

(56) References Cited

U.S. PATENT DOCUMENTS

2012/0126306 A1   5/2012   Kawaguchi et al.
2013/0102124 A1   4/2013   Nakazawa
2013/0248969 A1   9/2013   Suzuki \* cited by examiner

SEMICONDUCTOR MEMORY DEVICE AND FABRICATION METHOD THEREOF

CROSS-REFERENCES TO RELATED APPLICATIONS

This application claims the priority of Chinese patent application No. 201610192683.4, filed on Mar. 30, 2016, the entirety of which is incorporated herein by reference.

FIELD OF THE INVENTION

The present invention generally relates to the field of semiconductor manufacturing technology and, more particularly, relates to a semiconductor memory device and fabrication techniques thereof.

BACKGROUND

With the increasing integration degree of semiconductor devices and decreasingly reduction on dimensions of the devices and space between the adjacent devices, crosstalk between adjacent memory cells is more and more serious, easily causing many issues such as operating errors, and deterioration of electrical properties, etc. Therefore, how to reduce crosstalk between the adjacent memory cells becomes particularly important.

Currently, in a semiconductor memory device, dielectric between the adjacent memory cells is usually oxide, but the dielectric constant of the oxide is relatively large, about 3.9. To solve this issue, one method is to reduce the dielectric constant of the dielectric. That is, in fabrication processes, low dielectric constant materials are usually used to replace the dielectric with high dielectric constant, such as silicon oxide. However, when the process technology gradually evolves into smaller dimension, low dielectric constant materials have also been unable to meet the requirements.

Ideally, the dielectric constant of the dielectric can be reduced to 1.0, that is, the dielectric constant of vacuum. Therefore, a method is needed to reduce the dielectric constant of the dielectric between the adjacent memory cells to reduce the crosstalk. The disclosed device structures and methods are directed to solve one or more problems set forth above and other problems.

BRIEF SUMMARY OF THE DISCLOSURE

One aspect of the present disclosure includes a method for fabricating a semiconductor memory device. The method includes providing a substrate and forming a stacked layer on the substrate, wherein the stacked layer includes a tunneling dielectric layer and a floating gate layer sequentially formed on the substrate. The method also includes forming a plurality of stacked structures by etching the stacked layer and the substrate, wherein the spacing between the adjacent stacked structures forms a plurality of first trenches, and bottom of the first trenches exposes the substrate, and side walls of the first trenches expose the substrate, the tunneling dielectric layer, and the floating gate layer. In addition, the method includes forming a plurality of second trenches and forming a plurality of third trenches. Moreover, the method includes forming a second dielectric layer on the floating gate layer and the side wall and bottom of the third trenches and forming a control gate layer on the second dielectric layer to sufficiently fill the third trenches. Further, the method includes forming a plurality of fourth trenches by etching the control gate layer, the second dielec-tric layer and the floating gate layer; and removing the sacrificial layer along the fourth trenches.

Another aspect of the present disclosure includes a semiconductor memory device. The semiconductor memory device includes a substrate and a plurality of stacked structures formed on the substrate, wherein the stacked structures include a tunneling dielectric layer and a floating gate layer sequentially formed on the substrate, each stacked structure is parallel and evenly spaced to each other, the spacing between the adjacent stacked structures forms a plurality of first trenches, the first trenches extend into the inner of the substrate, bottom of the first trenches exposes the substrate, and side walls of the first trenches expose the substrate, the tunneling dielectric layer, and the floating gate layer. The semiconductor memory device also includes a first liner layer formed on inner walls of the first trenches, wherein a height of the first liner layer is higher than a height of the tunneling dielectric layer and lower than a height of the floating gate layer; and a first dielectric layer formed on the first liner layer, wherein a height of the first dielectric layer is lower than the height of the tunneling dielectric layer. In addition, the semiconductor memory device includes a second liner layer formed on the first liner layer and the first dielectric layer; and a plurality of air gaps formed in the first trenches and extended along a direction of the first trenches, wherein side walls and bottom of the air gaps expose the second liner layer. Moreover, the semiconductor memory device includes a second dielectric layer covering surfaces of the floating gate layer and the air gaps; and a control gate layer formed on the second dielectric layer. Further, the semiconductor memory device includes a plurality of fourth trenches formed in the control gate layer and the floating gate layer, wherein an extension direction of each fourth trench is parallel to each other and perpendicular to an extension direction of each first trench, and bottom of the fourth trenches exposes the surfaces of the tunneling dielectric layer and the air gaps; and a third dielectric layer formed in the fourth trenches to sufficiently fill the fourth trenches.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Figure 1:
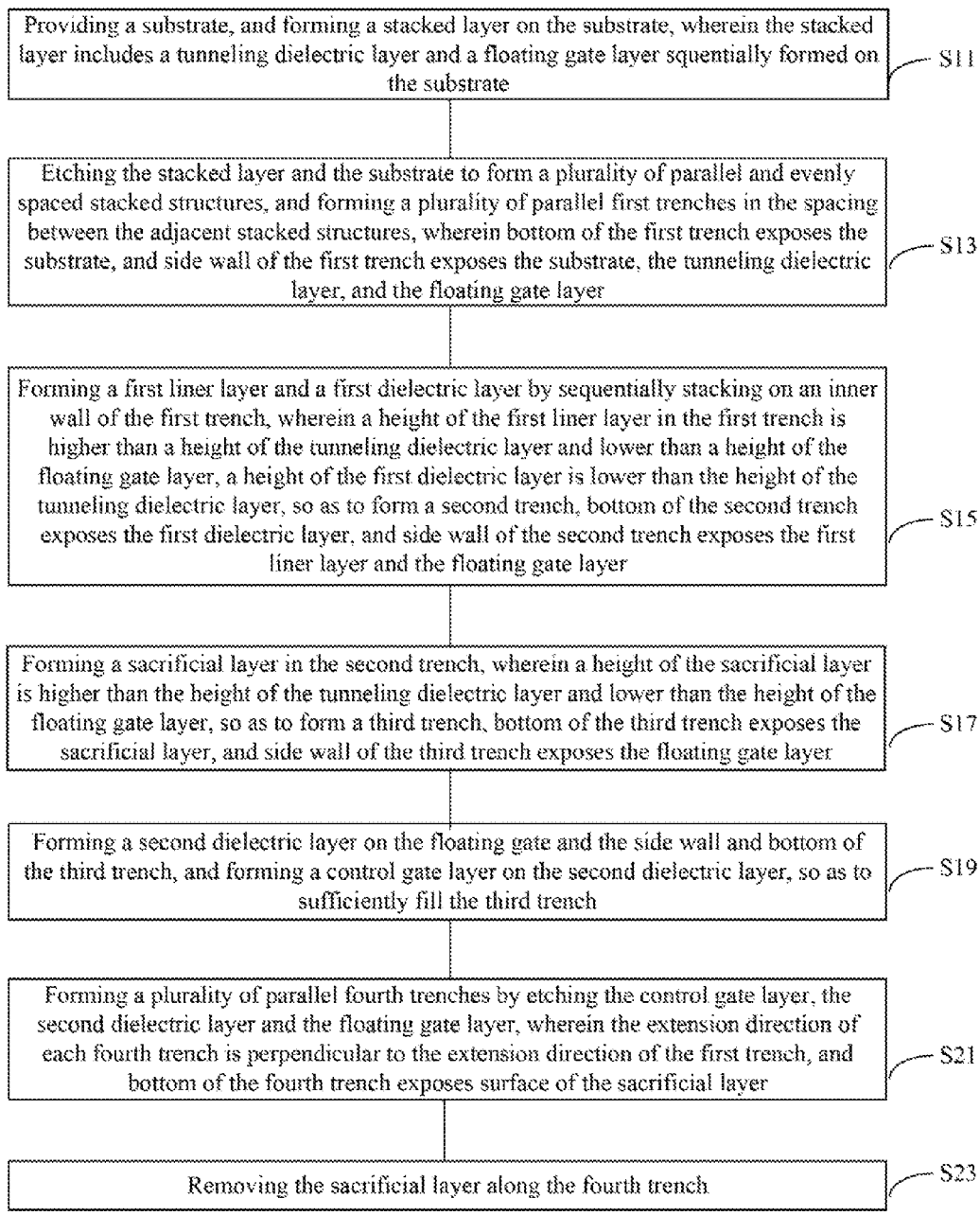
FIG. 1 illustrates an exemplary fabrication process to form a semiconductor memory device consistent with the disclosed embodiments.
Figure 12:
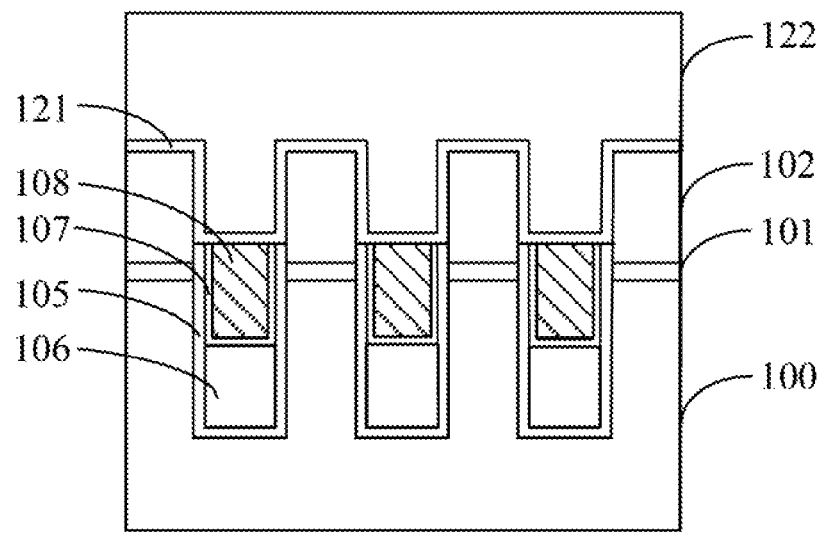
Figure 13:
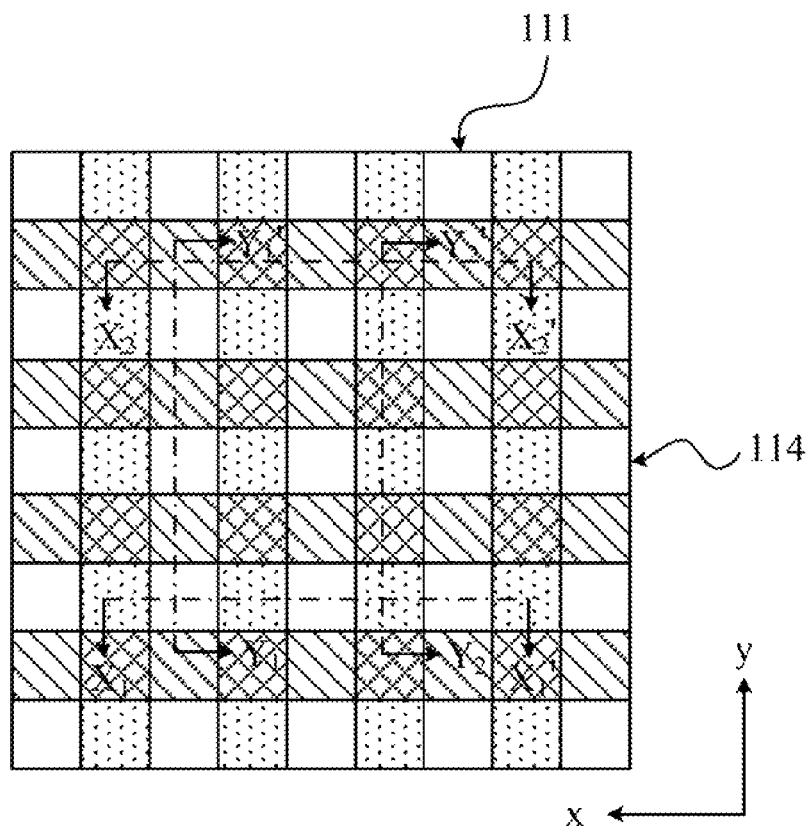
FIG. 13 illustrates a memory cell array area of a semiconductor memory device consistent with the disclosed embodiments.

FIG. 1 illustrates an exemplary fabrication process to form a semiconductor memory device consistent with the disclosed embodiments; FIGS. 2-12 and FIGS. 14-19 illustrate semiconductor memory device structures corresponding to certain stages of the exemplary fabrication process; and FIG. 13 illustrates a memory cell array area of the semiconductor memory device consistent with the disclosed embodiments.

Figure 2:
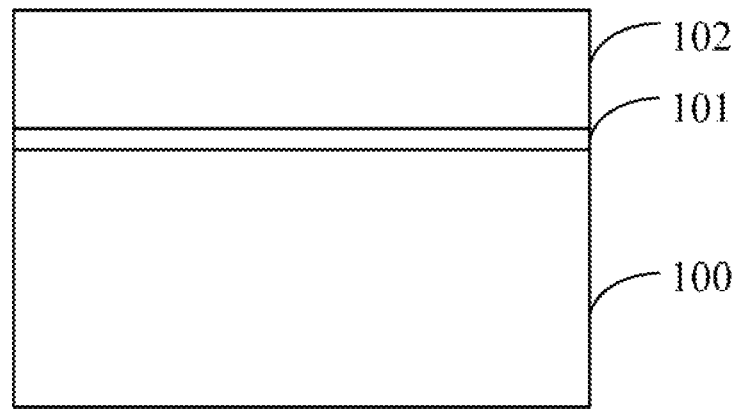
FIGS. 2-12 and FIGS. 14-19 illustrate semiconductor memory device structures corresponding to certain stages of a fabrication process of a semiconductor memory device consistent with the disclosed embodiments.

As shown in FIG. 1, at the beginning of the fabrication process, a substrate with certain structures may be provided (S11). FIG. 2 illustrates a corresponding semiconductor memory device structure.

Referring to FIG. 2, a substrate 100 may be provided, and a stacked layer may be formed on the substrate 100. The stacked layer may include a tunneling dielectric layer 101 and a floating gate layer 102 sequentially formed on the substrate 100.

The substrate 100 may include any appropriate material, such as monocrystalline silicon (Si), monocrystalline germanium (Ge), germanium-silicon alloy (GeSi), silicon carbide (SiC), silicon on insulator (SOI), germanium on insulator (GOI), or gallium arsenide (GaAs) and other III-V compounds thereof. In one embodiment, the substrate 100 may be monocrystalline silicon.

The tunneling dielectric layer 101 may be made of silicon oxide, or nitrogen doped silicon oxide, etc. The tunneling dielectric layer 101 may be formed by performing a thermal oxidation process onto the surface of the substrate 100. The thickness of the tunneling dielectric layer may be in a range of approximately 60-80 Å.

The floating gate layer 102 may be formed on the tunneling dielectric layer 101. The floating gate layer 102 may be made of metal, metal alloy, metal nitride, metal silicide, or metal composite, etc. The floating gate layer 102 may also be made of doped polysilicon, polysilicon-germanium alloy material, or polysilicon metal silicide material, etc. In one embodiment, the floating gate layer 102 may be made of doped polysilicon.

Figure 3:
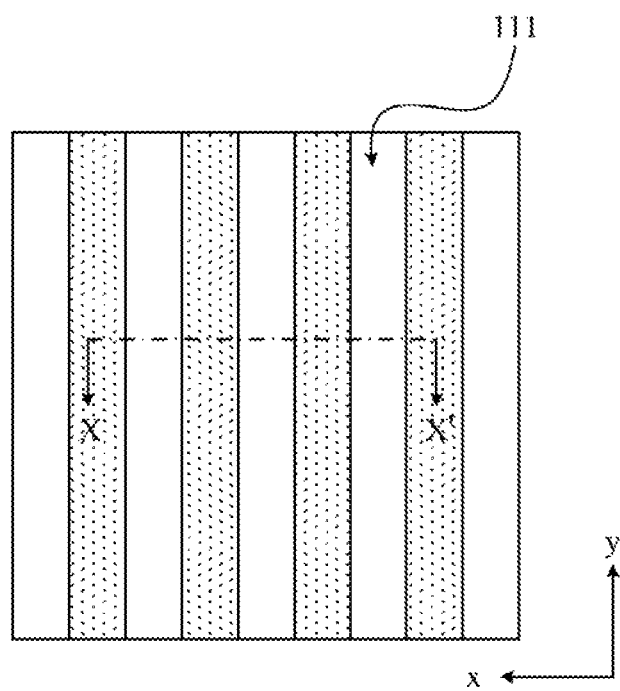
Figure 4:
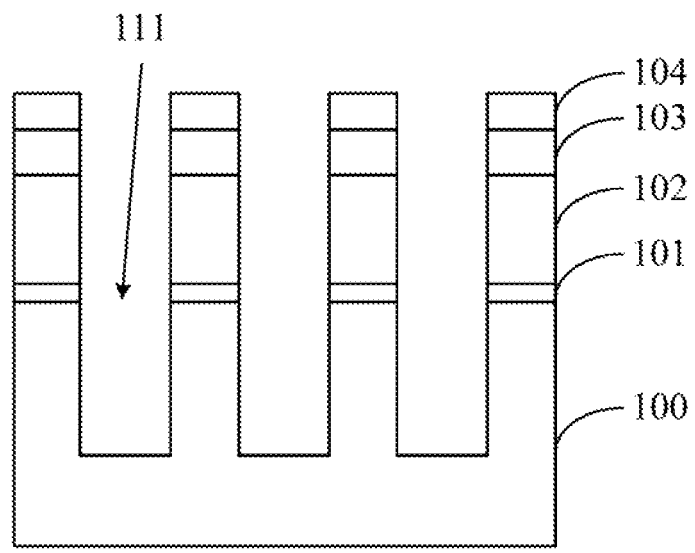

Returning to FIG. 1, after providing the substrate having the stacked layer, an etching process may be performed (S13). FIGS. 3-4 illustrate a corresponding semiconductor memory device structure. FIG. 3 is a top-view of the substrate 100 and the stacked layer toward the surface of the stacked layer shown in FIG. 4, and FIG. 4 is a cross-sectional view along a line XX' in FIG. 3.

Referring to FIG. 3 and FIG. 4, a stacked structure may be formed along the first direction y to isolate active areas in the substrate 100 by etching the stacked layer and the substrate 100. The number of the stacked structures may be more than one, and each stacked structure may be parallel and evenly spaced to each other. The spacing between the adjacent stacked structures may form a first trench 111. The number of the first trenches may be more than one, and each first trench may be parallel to each other. X and X' may be two points along the second direction x, and the second direction x may be perpendicular to the first direction y.

In one embodiment, forming the first trench 111 by etching the stacked layer and the substrate 100 may include: sequentially forming a patterned first hard mask layer 103 and a patterned hard mask oxide layer 104 on the substrate 100 and the stacked layer; and using the patterned first hard mask layer 103 and the patterned hard mask oxide layer 104 as a mask, the stacked layer and the substrate 100 may be etched along the first direction y to form the first trench 111. The bottom of the first trench 111 may expose the substrate 100, and the side wall of the first trench 111 may expose the substrate 100, the tunneling dielectric layer 101, the floating gate layer 102, the patterned first hard mask layer 103, and the patterned hard mask oxide layer 104. An anisotropic dry etching process may be performed to etch the stacked layer and the substrate 100. The patterned first hard mask layer 103 and the patterned hard mask oxide layer 104 may be configured to protect the surface of the stacked layer during the etching process of forming the first trench 111.

In certain other embodiments, only the first patterned first hard mask layer 103 may be formed on the substrate 100 and the stacked layer, without forming the patterned hard mask oxide layer 104. When the patterned first hard mask layer 103 is sufficient to protect the surface of the stacked layer, the patterned hard mask oxide layer 104 can be thinned or even removed.

Returning to FIG. 1, after forming the stacked structure and the first trench, a first liner layer, a first dielectric layer and a second trench may be formed (S15). FIGS. 5-8 illustrate corresponding semiconductor memory device structures.

Referring to FIGS. 5-8, a first liner layer and a first dielectric layer may be formed by sequentially stacking on the inner wall of the first trench 111. The height of the first liner layer in the first trench 111 may be higher than the height of the tunneling dielectric layer 101 and lower than the height of the floating gate layer 102. The height of the first dielectric layer may be lower than the height of the tunneling dielectric layer 101. Therefore, a second trench may be formed. The bottom of the second trench may expose the first dielectric layer, and the side wall of the second trench may expose the first liner layer and the floating gate layer.

Figure 5:
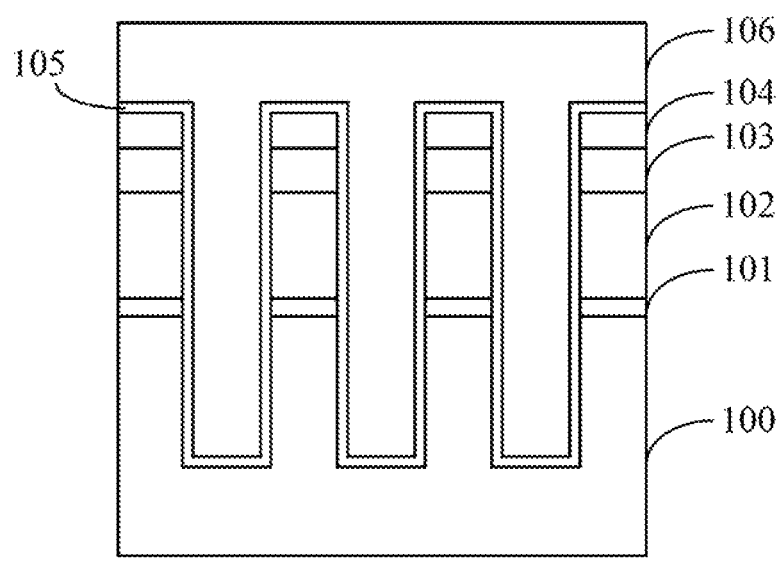

As shown in FIG. 5, forming the second trench may include forming the first liner layer 105 on the inner wall of the first trench 111 (shown in FIG. 4); and forming the first dielectric layer 106 on the first liner layer 105 to fill the first trench 111. The first liner layer 105 may cover the surface of the hard mask oxide layer 104, and the side wall and bottom of the first trench 11.

The first liner layer 105 may be made of silicon oxide. The process of forming the first liner layer 105 may be a high-temperature thermal oxidation process. The thickness of the first liner layer 105 may be in a range of approximately 50-150 Å. The first dielectric layer 106 may be made of silicon oxide, or glass, etc. The process of forming the first dielectric layer 106 may be a flowable chemical vapor deposition (FCVD) process, or a spin-coating process, etc.

In one embodiment, the flowable chemical vapor deposition (FCVD) process may be performed to form the first dielectric layer 106. The formed first dielectric layer 106 may readily extend into the first trench 111 between the substrate 100 and the stacked structure, and sufficiently fill the first trench 111. This way, defects may be difficult to form.

Specifically, the reactants of the flowable chemical vapor deposition (FCVD) process may include oxygen plasma, silicon source gas (such as SiHA), and carrier gas (such as nitrogen, hydrogen or inert gas), etc. First, the flowable chemical vapor deposition (FCVD) process may include performing a deposition process to form flowable silicon oxide material in the first trench 111 and on the hard mask oxide layer 104. The reaction temperature is lower than 100° C., the pressure is in a range of approximately 0.1-10 Torr, and the wafer temperature is in a range of approximately 0-150° C. The flowable silicon oxide material can preferentially enter into the first trench 111, such that the first trench 111 may be sufficiently filled. Then, the flowable chemical vapor deposition (FCVD) process may also include performing an annealing process to form solid silicon oxide. The annealing temperature may be in a range of approximately 300-600° C., and the annealing time may be in a range of approximately 20-40 minutes.

Figure 6:
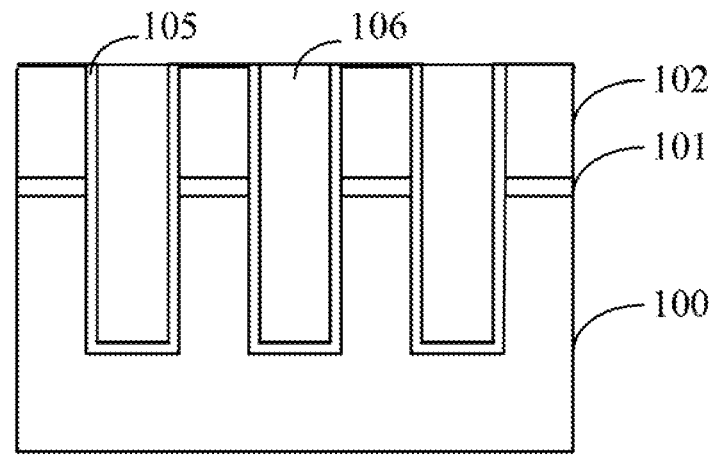

As shown in FIG. 6, forming the second trench may also include planarizing the first liner layer 105 and the first dielectric layer 106 until the surface of the floating gate layer 102 is exposed; and performing an annealing process to compact the first dielectric layer 106 to have a higher density.

In one embodiment, the planarization process may be a chemical mechanical polishing process. The annealing temperature may be in a range of approximately 400-900° C., and the annealing time may be in a range of approximately 20-50 minutes.

Figure 7:
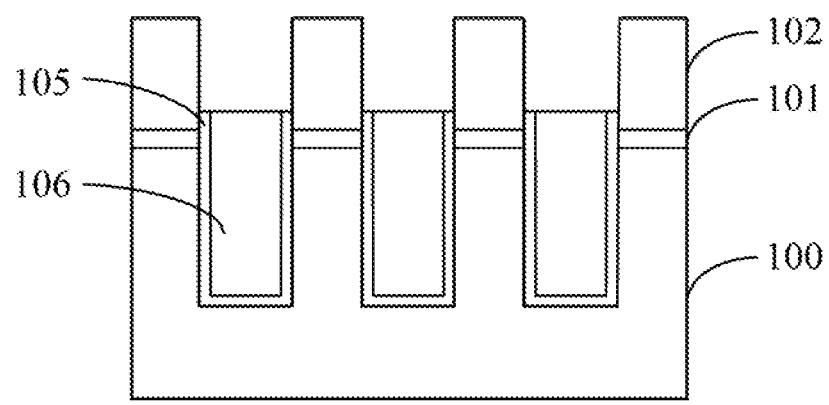

As shown in FIG. 7, in addition, forming the second trench may include performing a dry etching process to etch the first liner layer 105 and the first dielectric layer 106 such that the heights of the first liner layer 105 and the first dielectric layer 106 in the first trench 111 (shown in FIG. 4) may be higher than the height of the tunneling dielectric layer 101 and lower than the height of the floating gate layer 102, and the surface of the floating gate layer 102 may be exposed. The dry etching process may be an anisotropic dry etching process. The dry etching process may include reactive ion etching process (RIE), ion beam etching process, plasma etching process, or laser cutting process, etc.

Figure 8:
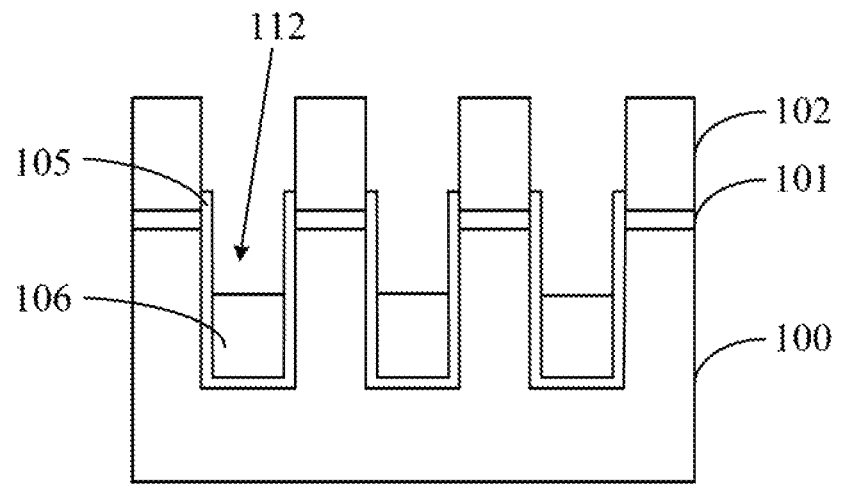

As shown in FIG. 8, further, forming the second trench may include performing a wet etching process having a first etching selectivity to etch the first dielectric layer 106, such that the height of the first dielectric layer in the first trench 111 (shown in FIG. 4) may be lower than the height of the tunneling dielectric layer 101, and the second trench 112 may be formed. The bottom of the second trench 112 may expose the first dielectric layer 106, and the side wall of the second trench 112 may expose the first liner layer 105 and the floating gate layer 102. The first etching selectivity may be that the etching rate of the first dielectric layer 106 is higher than the etching rate of the first liner layer 105.

Figure 9:
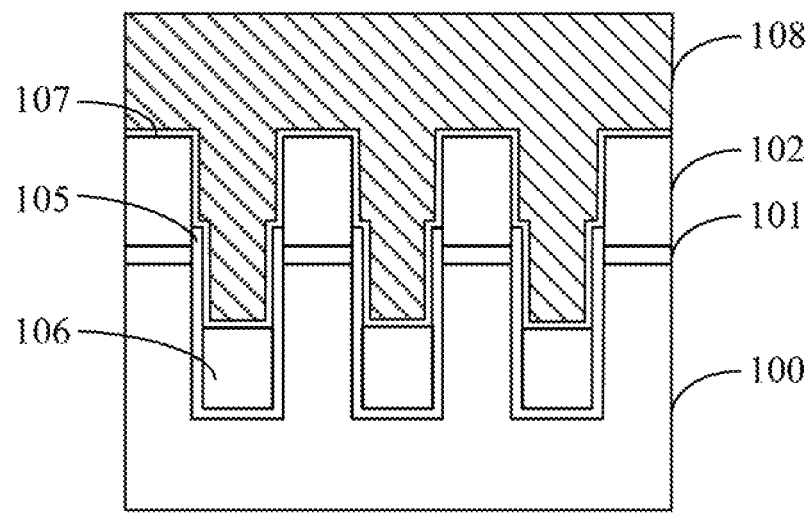
Figure 10:
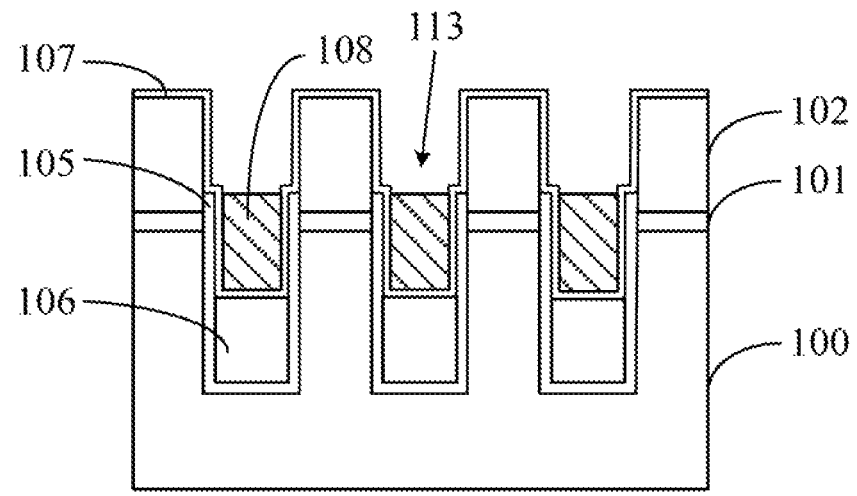
Figure 11:
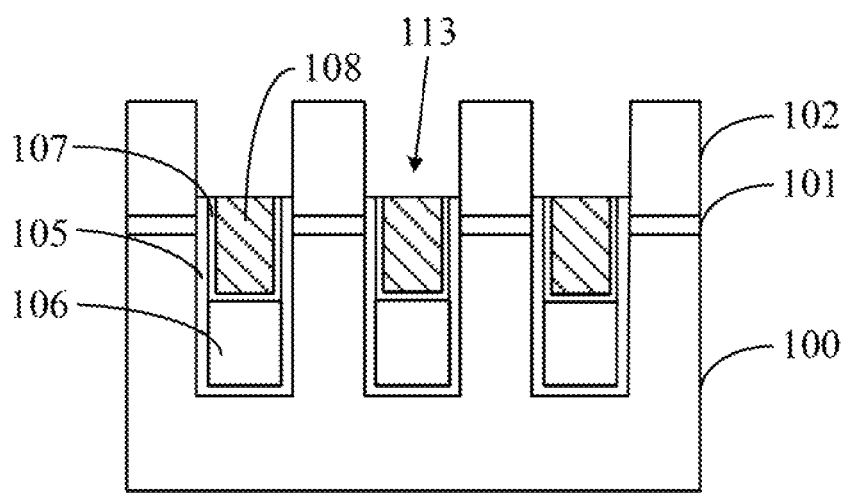

Returning to FIG. 1, after forming the second trench, a second liner layer, a sacrificial layer, and a third trench may be formed (S17). FIGS. 9-11 illustrate corresponding semiconductor memory device structures.

Referring to FIGS. 9-11, a sacrificial layer may be formed in the second trench 112. The height of the sacrificial layer may be higher than the height of the tunneling dielectric layer 101 and lower than the height of the floating gate layer 102, such that a third trench may be formed. The bottom of the third trench may expose the sacrificial layer, and the side wall of the third trench may expose the floating gate layer 102.

As shown in FIG. 9, forming the third trench may include forming a second liner layer 107 on the floating gate layer 102 and the side wall and bottom of the second trench 112; forming the sacrificial layer 108 in the second trench 112 (shown in FIG. 8) to sufficiently fill the second trench 112; and planarizing the sacrificial layer 108.

The second liner layer 107 may be configured to isolate the floating gate layer 102 and the sacrificial layer 108, and to protect the surface of the floating gate layer 102 from damages during a subsequent process of etching the sacrificial layer 108. The second liner layer 107 may be made of silicon oxide. The process of forming the second liner layer 107 may be a high-temperature thermal oxide process. The thickness of the second liner layer 107 may be in a range of approximately 30-80 Å. The sacrificial layer 108 may be made of polysilicon. The process of forming the sacrificial layer 108 may be a flowable chemical vapor deposition process, or a low-pressure chemical vapor deposition process, etc.

As shown in FIG. 10, forming the third trench may also include removing part of the sacrificial layer 108, such that the height of the sacrificial layer 108 may be higher than the height of the tunneling dielectric layer 101 and lower than the height of the floating gate layer 102, and the third trench 113 may be formed. The bottom of the third trench 113 may expose the sacrificial layer 108, and the side wall of the third trench may expose part of the second liner layer 107.

The method of removing part of the sacrificial layer 108 may include performing a dry etching process having a second etching selectivity or a wet etching process having the second etching selectivity to etch the sacrificial layer 108. The second etching selectivity may be that the etching rate of the sacrificial layer 108 is higher than the etching rate of the second liner layer 107.

As shown in FIG. 11, further, forming the third trench may include removing the second liner layer 107 formed on the floating gate layer 102 and the side wall of the third trench 113 to expose the surface of the floating gate layer 102. Because, after the etching process to remove part of the sacrificial layer 108, the second liner layer 107 may be subject to damages caused by the etching process. When a control gate layer is subsequently formed on the floating gate layer 102, a polysilicon inter-dielectric layer (Inter-Poly Dielectric, IPD) may need to be formed between the floating gate layer 102 and the control gate layer. To make the thickness of the polysilicon inter-dielectric layer uniform and easy to control, the second liner layer 107 may first need to be removed to expose the clean surface of the floating gate layer 102; then the polysilicon inter-dielectric layer may be formed. In one embodiment, the process of removing the second liner layer 107 formed on the floating gate layer 102 and the side wall of the third trench 113 may be a wet etching process.

Returning to FIG. 1, after forming the third trench, a second dielectric layer and a control gate layer may be formed (S19). FIG. 12 illustrates a corresponding semiconductor memory device structure.

As shown in FIG. 12, a second dielectric layer 121 may be formed on the floating gate layer 102 and the side wall and bottom of the third trench 113. A control gate layer 122 may be formed on the second dielectric layer 121 to sufficiently fill the third trench 113.

The second dielectric layer 121 may be formed on the floating gate layer 102 and the inner wall of the third trench 113. The second dielectric layer 121 may be configured as dielectric between the floating gate layer 102 and the control gate layer 122. Such that the floating gate layer 102, the second dielectric layer 121 and the control gate layer 122 may form a capacitor. The control gate layer 122 may use such capacitor to control the floating gate layer 102, and to improve the coupling ratio of the control gate layer 122 to the floating gate layer 102.

The second dielectric layer 121 may be made of a silicon oxide-silicon nitride-silicon oxide (Oxide-Nitride-Oxide, ONO) three-layer structure. In one embodiment, the process of forming the bottom silicon oxide in the ONO three-layer structure may be a thermal oxide process, or a chemical vapor deposition process, etc. The process of forming the middle silicon nitride in the ONO three-layer structure may be a low-pressure chemical vapor deposition process, or a plasma-enhanced chemical vapor deposition process, etc. The process of forming the top silicon oxide in the ONO three-layer structure may be a thermal oxidation process.

The thickness of the second dielectric layer 121 may be in a range of approximately 80-160 Å. The control gate layer 122 may be made of polysilicon.

Figure 14:
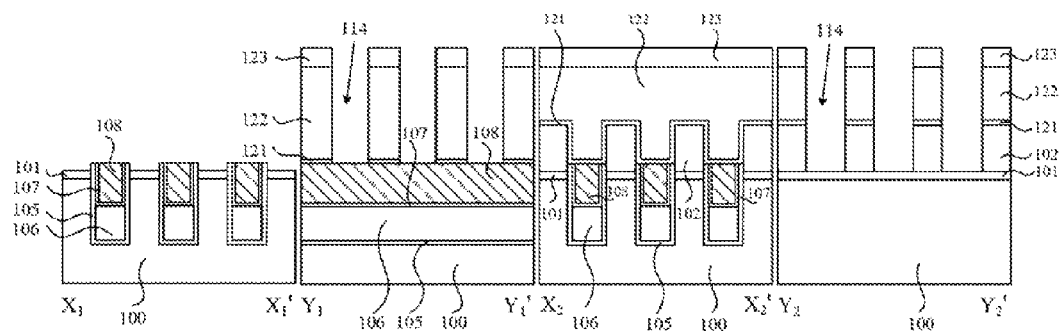

Returning to FIG. 1, after forming the second dielectric layer and the control gate layer, a fourth trench may be formed (S21). FIGS. 13-14 illustrate corresponding semiconductor memory device structures. FIG. 13 illustrates a memory cell array area of the semiconductor memory device consistent with the disclosed embodiments; and FIG. 14 illustrates combined cross-sectional views along lines $X_1X_1'$, $Y_1Y_1'$, $X_2X_2'$, and $Y_2Y_2'$ in FIG. 13.

Referring to FIGS. 13-14, a fourth trench 114 may be formed by etching the control gate layer 122, the second dielectric layer 121 and the floating gate layer 102 along the second direction x. The number of the fourth trench 114 may be more than one, and each fourth trench 114 may be parallel to each other. The extension direction of each fourth trench 114 may be perpendicular to the extension direction of each first trench 11. The bottom of the fourth trench 114 may expose the surfaces of the sacrificial layer 108 and the tunneling dielectric layer 101, and the side wall of the fourth trench 114 may expose the control gate layer 122, the second dielectric layer 121 and the floating gate layer 102.

In one embodiment, etching the control gate layer 122, the second dielectric layer 121 and the floating gate layer 102 may include: forming a patterned second hard mask layer 123 on the control gate layer 122; and using the patterned second hard mask layer 123 as a mask, a wet etching process or an anisotropic dry etching process may be performed to etch the control gate layer 122, the second dielectric layer 121 and the floating gate layer 102 to form the fourth trench 114.

Returning to FIG. 1, after forming the fourth trench, the sacrificial layer may be removed (S23). FIGS. 15-18 illustrate corresponding semiconductor memory device structures. FIGS. 15-18 illustrate combined cross-sectional views along lines $X_1X_1'$, $Y_1Y_1'$, $X_2X_2'$, and $Y_2Y_2'$ in FIG. 13, the sacrificial layer 108 may be removed along the fourth trench 114.

Figure 15:
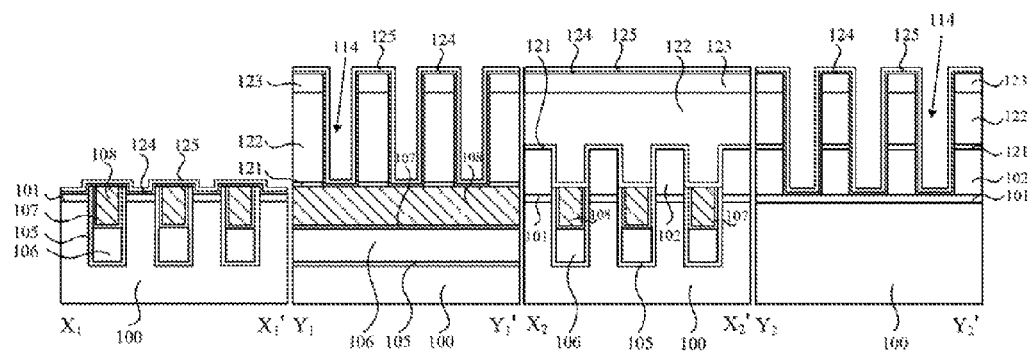

As shown in FIG. 15, removing the sacrificial layer 108 may include sequentially forming a third liner layer 124 and a fourth liner layer 125 on the second hard mask layer 123 and the side wall and bottom of the fourth trench 114. The third liner layer 124 and the fourth liner layer 125 may protect the surface of the control gate layer 122 from damages during subsequently removing the sacrificial layer 108 along the fourth trench 114.

At the same time, the thickness of the formed fourth liner layer 125 may precisely control the size of an opening formed at the bottom of the fourth trench 114 and configured to expose the sacrificial layer 108. In one embodiment, the third liner layer 124 may be made of silicon dioxide. The process of forming the third liner layer 124 may be a high-temperature thermal oxidation process. The thickness of the third liner layer 124 may be in a range of approximately 20-40 Å. The fourth liner layer 125 may be made of silicon dioxide. The process of forming the fourth liner layer 125 may be a chemical vapor deposition process. The thickness of the fourth liner layer 125 may be in a range of approximately 50-150 Å.

Figure 16:
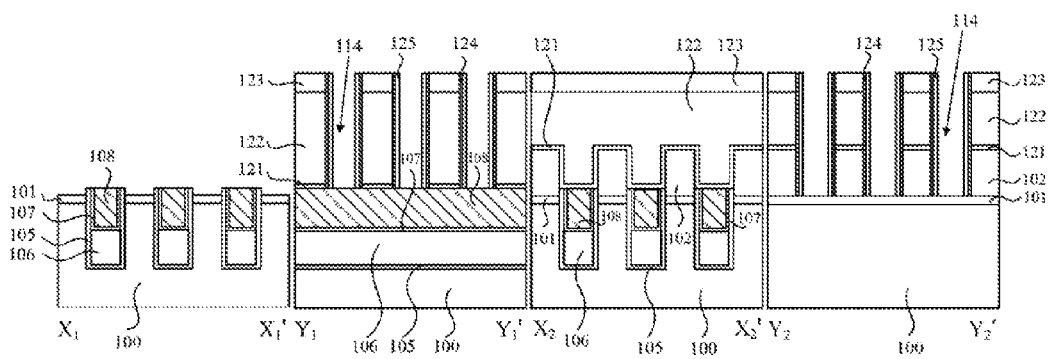

As shown in FIG. 16, removing the sacrificial layer 108 may also include removing the third liner layer 124 and the fourth liner layer 125 formed at the bottom of the fourth trench 114 until the surface of the sacrificial layer 108 is exposed to form an opening of removing the sacrificial layer 108 at the bottom of the fourth trench 114. In one embodiment, the process of removing the third liner layer 124 and the fourth liner layer 125 at the bottom of the fourth trench 114 may be an anisotropic dry etching process.

Because the anisotropic dry etching process is performed, the third liner layer 124 and the fourth liner layer 125 formed on the bottom of the fourth trench 114 and the second hard mask layer 123 may be removed, while the third liner layer 124 and the fourth liner layer 125 formed on the side wall of the fourth trench 114 may not be removed. Therefore, the side wall of the control gate layer 122 may be protected by the third liner layer 124 and the fourth liner layer 125, and the top of the control gate layer 122 may be protected by the second hard mask layer 123, thus avoiding damages to the control gate layer 122 when subsequently removing the sacrificial layer 108 along the fourth trench 114.

Figure 17:
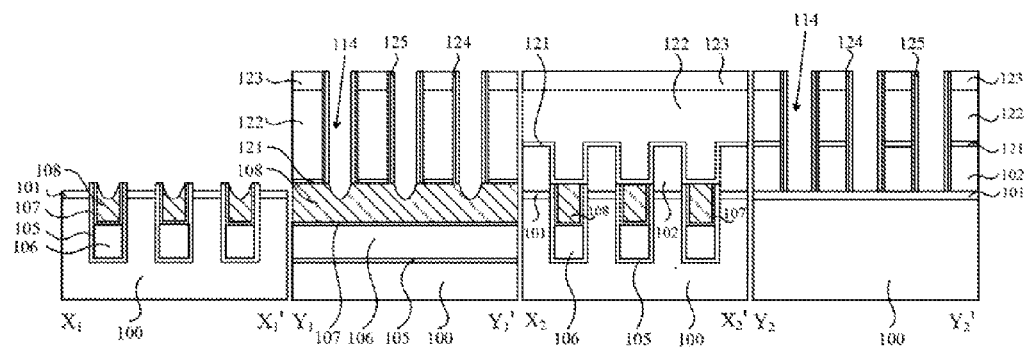

As shown in FIG. 17, in addition, removing the sacrificial layer 108 may include performing a dry etching process having a third etching selectivity to etch part of the sacrificial layer 108 exposed by the fourth trench 114. The third etching selectivity may be that the etching rate of the sacrificial layer 108 is higher than the etching rate of the second liner layer 107, the third liner layer 124, the fourth liner layer 125, and the second dielectric layer 121. In one embodiment, the sacrificial layer 108 may be made of polysilicon. The second liner layer 107, the third liner layer 124, the fourth liner layer 125, and the second dielectric layer 121 may be made of oxide. Therefore, the third etching selectivity may be that the etching rate of the polysilicon is higher than the etching rate of the oxide.

Figure 18:
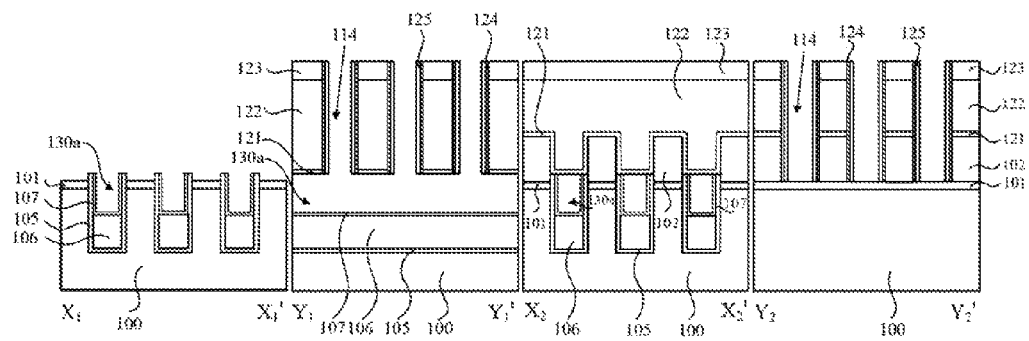

As shown in FIG. 18, further, removing the sacrificial layer 108 may include performing a wet etching process having the third etching selectivity to further etch the sacrificial layer 108 to thoroughly remove the sacrificial layer 108 (shown in FIG. 17), and to form an air gap 130a between the second liner layer 107 and the second dielectric layer 121 and extended along the direction of the first trench 111 (the first direction y, shown in FIG. 3).

That is, a two-step etching process may be performed. Before performing the wet etching process having the third etching selectivity, the dry etching process having the third etching selectivity may be performed to etch the sacrificial layer 108. Such that the dry etching process may increase the contact area between the etchant of the subsequent wet etching process and the sacrificial layer 108, and help the wet etching process to thoroughly remove the sacrificial layer 108 under the control gate layer 122.

Figure 19:
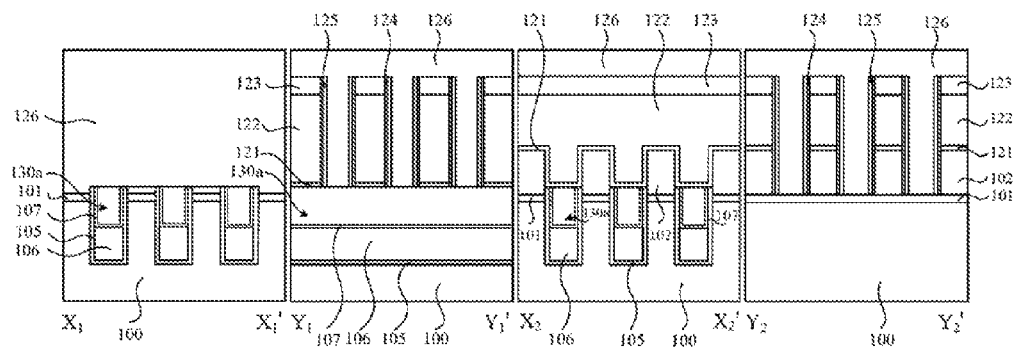

FIG. 19 illustrates combined cross-sectional views along lines $X_1X_1'$, $Y_1Y_1'$, $X_2X_2'$, and $Y_2Y_2'$ in FIG. 13. As shown in FIG. 19, after removing the sacrificial layer 108 along the fourth trench 114, the method may also include forming a third dielectric layer 126 on the second hard mask layer 123 and the fourth liner layer 125 to sufficiently fill the fourth trench 114, where the bottom of the third dielectric layer 126 may be above the air gap 130a. In one embodiment, the third dielectric layer 126 may be made of silicon oxide. The process of forming the third dielectric layer 126 may be a plasma-enhanced chemical vapor deposition process.

Figure 20:
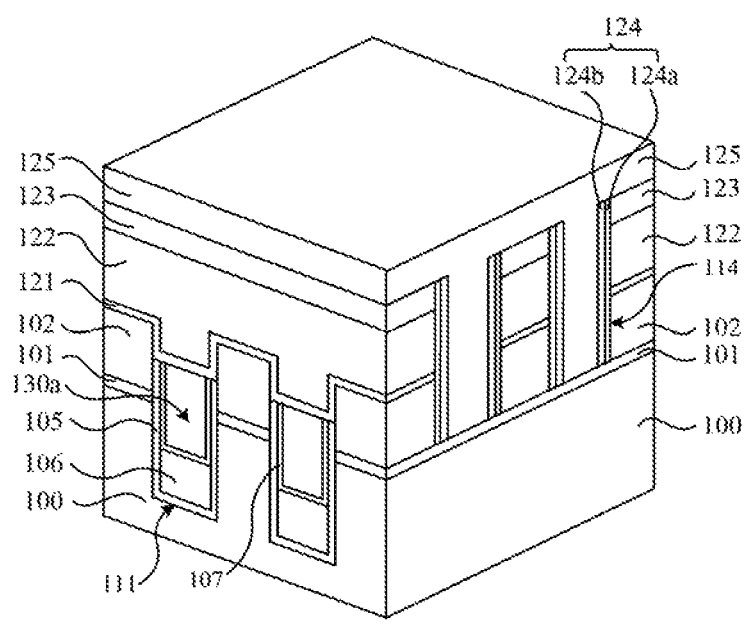
FIG. 20 illustrates a three-dimensional structure of a semiconductor memory device consistent with the disclosed embodiments.

Correspondingly, a semiconductor memory device is provided. FIG. 20 illustrates a three-dimensional structure of the semiconductor memory device consistent with the disclosed embodiments.

As shown in FIG. 20, the semiconductor memory device may include a substrate 100 and a stacked structure. The number of the stacked structure may be more than one, and each stacked structure may be parallel and evenly spaced to each other. The stacked structure may include a tunneling dielectric layer 101 and a floating gate layer 102 sequentially formed on the substrate. A first trench 111 may be formed between the adjacent stacked structures. The first trench 111 may extend into the inner of the substrate 100. The bottom of the first trench 111 may expose the substrate 100, and the side wall of the first trench 111 may expose the substrate 100, the tunneling dielectric layer 101, and the floating gate layer 102.

The semiconductor memory device may also include a first liner layer 105 formed on the inner wall of the first trench 111 and a first dielectric layer 106 formed on the first liner layer 105. The height of the first liner layer 105 in the first trench 111 may be higher than the height of the tunneling dielectric layer 101 and lower than the height of the floating gate layer 102. The height of the first dielectric layer in the first trench 111 may be lower than the height of the tunneling dielectric layer 101.

In addition, the semiconductor memory device may include a second liner layer 107 formed on the first liner layer 105 and the first dielectric layer 106, and an air gap 130a formed in the first trench 111 and extended along the direction of the first trench 111. The side wall and bottom of the air gap 130a may expose the second liner layer 107.

Moreover, the semiconductor memory device may include a second dielectric layer 121 covering the surfaces of the floating gate layer 102 and the air gap 130a; a control gate layer 122 formed on the second dielectric layer 121; and a fourth trench 114 formed in the control gate layer 122 and the floating gate layer 102. The number of the fourth trench 114 may be more than one, and the extension direction of each fourth trench 114 may be parallel to each other and perpendicular to the extension direction of each first trench 111. The bottom of the fourth trench 114 may expose the surfaces of the tunneling dielectric layer 101 and the air gap 130a.

Further, the semiconductor memory device may include a third dielectric layer 126 formed in the fourth trench 114 to sufficiently fill the fourth trench 114. The height of the air gap 130a may be higher than the height of the tunneling dielectric layer 101 and lower than the height of the floating gate layer 102. The lateral dimensions of the air gaps 130a may be larger than 150 Å.

In certain other embodiments, a second hard mask layer 123 may be formed on the control gate layer 122 to protect the control gate layer 122. The third dielectric layer 126 may be formed in the fourth trench 114 and on the second hard mask layer 123.

In certain other embodiments, the semiconductor memory device may also include a third liner layer 124 and a fourth liner layer 125. The third liner layer 124 may be formed on the side wall of the fourth trench 114, and the fourth liner layer 125 may be formed on the third liner layer 124. The third dielectric layer 126 may be formed on the second hard mask layer 123 and the fourth liner layer 125, and may sufficiently fill the fourth trench 114. The third liner layer 124 may be made of silicon dioxide. The thickness of the third liner layer 124 may be in a range of approximately 20-40 Å. The fourth liner layer 125 may be made of silicon dioxide. The thickness of the fourth liner layer 125 may be in a range of approximately 50-150 Å.

The first liner layer 105 may be made of silicon oxide. The thickness of the first liner layer 105 may be in a range of approximately 50-150 Å. The first dielectric layer 106 may be made of silicon oxide, or glass, etc. The second liner layer 107 may be made of silicon oxide. The thickness of the second liner layer 107 may be in a range of approximately 30-80 Å. The second dielectric layer 121 may be made of a silicon oxide-silicon nitride-silicon oxide three-layer structure. The thickness of the second dielectric layer 121 may be in a range of approximately 80-160 Å. The third dielectric layer 126 may be made of silicon oxide.

Accordingly, by forming the first liner layer and the first dielectric layer near the tunneling dielectric layer in the first trench and performing the etching process having the first etching selectivity to etch the first dielectric layer, the height of the first dielectric layer may be lower than the height of the tunneling dielectric layer, so as to form the second trench. Then, by forming the sacrificial layer in the second trench, a space may be occupied for subsequently forming the air gap. Further, by forming the opening exposed the surface of the sacrificial layer in the fourth trench and removing the sacrificial layer through the opening, the air gap may be formed between the second liner layer and the second dielectric layer and extended along the direction of the first trench. Because the dielectric constant of air is low and the air gap may be formed near the tunneling dielectric layer prone to interference between the adjacent floating gate layers, which may greatly reduce the interference between the bit lines and improve the performance of the semiconductor memory device.

Further, in the fabrication process, before removing the sacrificial layer along the fourth trench, the third liner layer and the fourth liner layer may be sequentially formed on the side wall of the fourth trench. Therefore, a protection layer may be formed on the control gate layer to avoid damages to the control gate layer during subsequently removing the sacrificial layer along the fourth trench. Moreover, the thickness of the fourth liner layer may precisely control the size of an opening formed at the bottom of the fourth trench and configured to expose the sacrificial layer.

In addition, in the fabrication process, the two-step etching process may be performed to remove the sacrificial layer along the fourth trench. That is, before performing the wet etching process having the third etching selectivity, performing the dry etching process having the third etching selectivity to etch the sacrificial layer, which may increase the contact area between the etchant of the subsequent wet etching process and the sacrificial layer, and help the wet etching process to thoroughly remove the sacrificial layer under the control gate layer.

In the semiconductor memory device consistent with the disclosed embodiments, the first dielectric layer may be formed near the substrate in the first trench to isolate the adjacent active areas in the substrate. The air gap may be formed near the tunneling dielectric layer in the first trench. Because the dielectric constant of air is low and the air gap may be formed near the tunneling dielectric layer prone to interference between the adjacent floating gate layers, which may greatly reduce the interference between the bit lines and improve the performance of the semiconductor memory device. In addition, the air gap may be formed between the second liner layer and the second dielectric layer, such that the shape and location of the air gap may be easily controlled.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor memory device, comprising:
   providing a substrate;
   forming a stacked layer on the substrate, wherein the stacked layer includes a tunneling dielectric layer and a floating gate layer sequentially formed on the substrate;
   forming a plurality of stacked structures by etching the stacked layer and the substrate, wherein the spacing between the adjacent stacked structures forms a plurality of first trenches, and bottom of the first trenches exposes the substrate, and side walls of the first trenches expose the substrate, the tunneling dielectric layer, and the floating gate layer;
   forming a plurality of second trenches;
   forming a plurality of third trenches;
   forming a second dielectric layer on the floating gate layer and the side wall and bottom of the third trenches;
   forming a control gate layer on the second dielectric layer to sufficiently fill the third trenches;
   forming a plurality of fourth trenches by etching the control gate layer, the second dielectric layer and the floating gate layer; and
   removing the sacrificial layer along the fourth trenches.

2. The method according to claim 1, wherein forming the second trenches includes:
   forming a first liner layer on the inner wall of the first trenches;
   forming a first dielectric layer on the first liner layer to fill the first trenches;
   planarizing the first liner layer and the first dielectric layer;
   performing an annealing process;
   performing a dry etching process to etch the first liner layer and the first dielectric layer, wherein heights of the first liner layer and the first dielectric layer in the first trenches are higher than a height of the tunneling dielectric layer and lower than a height of the floating gate layer; and
   performing a wet etching process having a first etching selectivity to etch the first dielectric layer, wherein the height of the first dielectric layer in the first trenches is lower than the height of the tunneling dielectric layer, bottom of the second trenches exposes the first dielectric layer, side walls of the second trenches expose the first liner layer and the floating gate layer, and the first etching selectivity is that an etching rate of the first dielectric layer is higher than an etching rate of the first liner layer.

3. The method according to claim 1, wherein:
   the first liner layer is made of silicon oxide;
   a process of forming the first liner layer is a high-temperature thermal oxidation process; and
   a thickness of the first liner layer is in a range of approximately 50-150 Å.

4. The method according to claim 1, wherein:
   the first dielectric layer is made of silicon oxide; and
   a process of forming the first dielectric layer includes a flowable chemical vapor deposition process, or a spin-coating process.

5. The method according to claim 1, wherein forming the third trenches includes:
   forming a second liner layer on the floating gate layer and the side walls and bottom of the second trenches;
   forming a sacrificial layer on the second liner layer to sufficiently fill the second trenches;
   planarizing the sacrificial layer;
   removing part of the sacrificial layer, wherein a height of the sacrificial layer is higher than the height of the tunneling dielectric layer and lower than the height of the floating gate layer; and
   removing the second liner layer formed on the floating gate and exposed by the side walls of the third trenches, wherein bottom of the third trenches exposes the sacrificial layer, and side walls of the third trenches expose the floating gate layer and part of the second liner layer.

6. The method according to claim 5, wherein:
   the second liner layer is made of silicon oxide;
   a process of forming the second liner layer includes a high-temperature thermal oxide process; and
   a thickness of the second liner layer is in a range of approximately 30-80 Å.

7. The method according to claim 5, wherein removing part of the sacrificial layer includes:
   performing a dry etching process having a second etching selectivity or a wet etching process having the second etching selectivity to etch the sacrificial layer, wherein the second etching selectivity is that an etching rate of the sacrificial layer is higher than an etching rate of the second liner layer.

8. The method according to claim 1, wherein removing the sacrificial layer along the fourth trenches includes:
   sequentially forming a third liner layer and a fourth liner layer on the side walls and bottom of the fourth trenches;
   removing the third liner layer and the fourth liner layer at the bottom of the fourth trenches to expose the surface of the sacrificial layer;
   performing a dry etching process having a third etching selectivity to etch part of the sacrificial layer exposed by the bottom of the fourth trenches, wherein the third etching selectivity is that the etching rate of the sacrificial layer is higher than the etching rate of the second liner layer, the third liner layer, the fourth liner layer, and the second dielectric layer; and
   performing a wet etching process having the third etching selectivity to further etch the sacrificial layer to thoroughly remove the sacrificial layer, and to form an air gap between the second liner layer and the second dielectric layer and extended along the direction of the first trenches.

9. The method according to claim 8, after removing the sacrificial layer along the fourth trenches, further including:
   forming a third dielectric layer on the fourth liner layer to sufficiently fill the fourth trenches, wherein bottom of the third dielectric layer is above the air gap.

10. The method according to claim 8, wherein:
    the third liner layer is made of silicon dioxide;
    a process of forming the third liner layer is a high-temperature thermal oxidation process;
    a thickness of the third liner layer is in a range of approximately 20-40 Å;
    the fourth liner layer is made of silicon dioxide;
    a process of forming the fourth liner layer is a chemical vapor deposition process; and
    a thickness of the fourth liner layer is in a range of approximately 50-150 Å.

11. The method according to claim 1, wherein:
    the sacrificial layer is made of polysilicon; and
    a process of forming the sacrificial layer is a flowable chemical vapor deposition process, or a low-pressure chemical vapor deposition process.

12. The method according to claim 1, wherein:
the second dielectric layer is made of a silicon oxide-silicon nitride-silicon oxide three-layer structure;
a process of forming the bottom silicon oxide in the silicon oxide-silicon nitride-silicon oxide three-layer structure includes a thermal oxide process, or a chemical vapor deposition process;
a process of forming the middle silicon nitride in the silicon oxide-silicon nitride-silicon oxide three-layer structure includes a low-pressure chemical vapor deposition process, or a plasma-enhanced chemical vapor deposition process;
a process of forming the top silicon oxide in the silicon oxide-silicon nitride-silicon oxide three-layer structure includes a thermal oxide process; and
a thickness of the second dielectric layer is in a range of approximately 80-160 Å.

* * * * *